US008154084B2

(12) United States Patent
Hoentschel et al.

(10) Patent No.: US 8,154,084 B2
(45) Date of Patent: Apr. 10, 2012

(54) PERFORMANCE ENHANCEMENT IN PMOS AND NMOS TRANSISTORS ON THE BASIS OF SILICON/CARBON MATERIAL

(75) Inventors: Jan Hoentschel, Dresden (DE); Vassilios Papageorgiou, Austin, TX (US); Belinda Hannon, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 264 days.

(21) Appl. No.: 12/473,726

(22) Filed: May 28, 2009

(65) Prior Publication Data

US 2010/0025771 A1 Feb. 4, 2010

(30) Foreign Application Priority Data

Jul. 31, 2008 (DE) .................. 10 2008 035 816

(51) Int. Cl.
*H01L 21/70* (2006.01)
(52) U.S. Cl. ........ 257/369; 257/607; 257/609; 257/616; 257/E21.041; 257/E21.049; 257/E21.127
(58) Field of Classification Search .................. None
See application file for complete search history.

(56) References Cited

U.S. PATENT DOCUMENTS

| 5,824,584 | A  | * | 10/1998 | Chen et al. .............. 438/267 |
| 7,205,586 | B2 | * | 4/2007  | Takagi et al. ............ 257/192 |
| 7,521,365 | B2 | * | 4/2009  | Kim et al. ............... 438/694 |
| 7,544,997 | B2 | * | 6/2009  | Zhang et al. ............ 257/344 |
| 7,592,619 | B2 | * | 9/2009  | Tsai et al. ............... 257/19  |
| 7,648,853 | B2 | * | 1/2010  | Bauer .................... 438/87  |
| 7,662,680 | B2 | * | 2/2010  | Giles ..................... 438/162 |
| 7,674,668 | B2 | * | 3/2010  | Ishitsuka et al. ........ 438/198 |
| 7,709,363 | B2 | * | 5/2010  | Suguro .................. 438/514 |
| 7,749,847 | B2 | * | 7/2010  | Cabral et al. ........... 438/285 |
| 7,791,064 | B2 | * | 9/2010  | Shimamune et al. ..... 257/19   |
| 7,812,370 | B2 | * | 10/2010 | Bhuwalka et al. ....... 257/192 |

(Continued)

FOREIGN PATENT DOCUMENTS

DE 102006015087 A1 10/2007

OTHER PUBLICATIONS

PCT Search Report and Written Opinion from PCT/US2009/004417 dated Nov. 16, 2009.

(Continued)

*Primary Examiner* — Eugene Lee
*Assistant Examiner* — Mohammed Shamsuzzaman
(74) *Attorney, Agent, or Firm* — Williams, Morgan & Amerson, P.C.

(57) ABSTRACT

A silicon/germanium material and a silicon/carbon material may be provided in transistors of different conductivity type on the basis of an appropriate manufacturing regime without unduly contributing to overall process complexity. Furthermore, appropriate implantation species may be provided through exposed surface areas of the cavities prior to forming the corresponding strained semiconductor alloy, thereby additionally contributing to enhanced overall transistor performance. In other embodiments a silicon/carbon material may be formed in a P-channel transistor and an N-channel transistor, while the corresponding tensile strain component may be overcompensated for by means of a stress memorization technique in the P-channel transistor. Thus, the advantageous effects of the carbon species, such as enhancing overall dopant profile of P-channel transistors, may be combined with an efficient strain component while enhanced overall process uniformity may also be accomplished.

18 Claims, 10 Drawing Sheets

U.S. PATENT DOCUMENTS

| | | | |
|---|---|---|---|
| 7,863,171 B2 * | 1/2011 | Hoentschel et al. | 438/528 |
| 7,898,028 B2 * | 3/2011 | Chang et al. | 257/338 |
| 7,927,989 B2 * | 4/2011 | Zhang et al. | 438/524 |
| 2002/0072176 A1 | 6/2002 | Park et al. | 438/286 |
| 2004/0084754 A1 * | 5/2004 | Geiss et al. | 257/565 |
| 2006/0006499 A1 * | 1/2006 | Farrar et al. | 257/607 |
| 2006/0220127 A1 * | 10/2006 | Mantl | 257/347 |
| 2007/0010077 A1 * | 1/2007 | Riess et al. | 438/548 |
| 2007/0018252 A1 | 1/2007 | Zhu | 257/369 |
| 2007/0048907 A1 | 3/2007 | Lee et al. | 438/142 |
| 2007/0072376 A1 | 3/2007 | Chen et al. | 438/275 |
| 2007/0196991 A1 | 8/2007 | Nandakumar et al. | 438/303 |
| 2007/0228482 A1 | 10/2007 | Wei et al. | 257/369 |
| 2007/0252205 A1 * | 11/2007 | Hoentschel et al. | 257/347 |
| 2007/0254461 A1 * | 11/2007 | Wei et al. | 438/514 |
| 2008/0166841 A1 | 7/2008 | Hsieh | 438/229 |
| 2008/0296612 A1 * | 12/2008 | Schmidt et al. | 257/139 |
| 2009/0026582 A1 * | 1/2009 | Herner | 257/616 |
| 2009/0278233 A1 * | 11/2009 | Pinnington et al. | 257/615 |
| 2010/0140744 A1 * | 6/2010 | Bauer | 257/607 |
| 2010/0200954 A1 * | 8/2010 | Del Agua Borniquel et al. | 257/607 |
| 2011/0034014 A1 * | 2/2011 | Hatem et al. | 438/530 |

OTHER PUBLICATIONS

Translation of Official Communication from German Patent Office for German Patent Application No. 10 2008 035 816.9 dated Apr. 15, 2009.

* cited by examiner

PERFORMANCE ENHANCEMENT IN PMOS AND NMOS TRANSISTORS ON THE BASIS OF SILICON/CARBON MATERIAL

BACKGROUND OF THE INVENTION

1. Field of the Invention

Generally, the present disclosure relates to integrated circuits, and, more particularly, to the formation of different transistor types having strained channel regions by using an embedded strain-inducing material to enhance charge carrier mobility in the channel regions.

2. Description of the Related Art

Integrated circuits have found a widespread applicability in many fields due to the continuous increase of functions that may be provided on a given chip area. Integrated circuits are composed of numerous individual circuit components, such as transistors, wherein several million or even several hundred million individual transistors may be provided in complex devices. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode formed near to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

The continuous size reduction of the critical dimensions, i.e., the gate length of the transistors, necessitates the adaptation and possibly the new development of highly complex process techniques concerning the above-identified process steps. It has, therefore, been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region having a standard (100) surface orientation may increase the mobility of electrons, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In one approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked, and subsequently the silicon/germanium layer is selectively formed in the PMOS transistor by epitaxial growth. Thus, complex manufacturing steps, such as etch processes, the formation of appropriate etch and growth masks and selective epitaxial growth techniques have to be incorporated into the CMOS process flow.

In other approaches, silicon/carbon material may be used for NMOS transistors to create a desired lattice mismatch specifically in the channel regions of the NMOS transistors, which may frequently be accomplished by ion implantation of carbon into the drain and source regions. However, the performance gain for transistors of different conductivity type on the basis of silicon/carbon alloys may lead to an even more complex process flow, as the various steps for the formation of respective strain layers may have to be appropriately integrated in the complex manufacturing flow, which may result in a less pronounced performance gain than expected.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices which enable the manufacture of differently strained semiconductor materials embedded into drain and source areas, wherein at least a semiconductor alloy may be used having a natural lattice constant that is less compared to a natural lattice constant of silicon. For example, in some illustrative aspects disclosed herein, a silicon/carbon alloy may be used in combination with a further semiconductor alloy, such as a silicon/germanium alloy, to provide different types of strain for transistors of different conductivity type, while nevertheless providing an efficient manufacturing strategy, for instance with respect to using appropriate etch stop and spacer layers and/or incorporating appropriate implantation species prior to forming the corresponding semiconductor alloys. Hence, the advantages of each of the different semiconductor alloys may be taken advantage of while not unduly contributing to additional process complexity compared to conventional strategies in which usually a single strain-inducing semiconductor alloy may be used. In other illustrative aspects disclosed herein, a semiconductor material, such as silicon/carbon, which may typically be employed for enhancing characteristics of N-channel transistors, may also be provided in P-channel transistors in combination with sophisticated stress memorization techniques, thereby obtaining a desired type of strain in the P-channel transistors while at the same time enabling enhanced overall manufacturing efficiency and additional gain in transistor performance due to the positive effects of the carbon species in the drain and source areas of the P-channel transistor.

One illustrative method disclosed herein relates to forming a strained semiconductor material in a first transistor of a first conductivity type and a second transistor of a second conductivity type. The method comprises forming a stack of layers above a first gate electrode structure of the first transistor and a second gate electrode structure of the second transistor, wherein the first and second gate electrode structures comprise a respective cap layer and wherein the stack of layers comprises a spacer layer and an etch stop layer formed above the spacer layer. The method additionally comprises forming a mask above the second transistor by using the etch stop layer and forming a first spacer element at the first gate electrode structure from the spacer layer. Moreover, first cavities are formed in drain and source areas of the first transistor on the basis of the first spacer element and a first strained semiconductor material is formed in the first cavities. The method further comprises forming second cavities in drain and source areas of the second transistor on the basis of the second spacer element formed from the spacer layer. Finally, the method comprises forming a second strained semiconductor material in the second cavities, wherein the first and second strained semiconductor materials have a different material composition.

A further illustrative method disclosed herein comprises forming first cavities adjacent to a first gate electrode structure of a first transistor and second cavities adjacent to a second gate electrode structure of a second transistor, wherein the first and second transistors are of different conductivity type. The method further comprises forming a semiconductor material in the first and second cavities, wherein the semiconductor material has a first type of strain. Moreover, lattice damage is created in the semiconductor material selectively in the first transistor to form a substantially relaxed semiconductor material. Furthermore, the method comprises re-crystallizing the substantially relaxed semiconductor material in a strained state that corresponds to a second type of strain that is opposite to the first type of strain.

One illustrative semiconductor device disclosed herein comprises a first transistor comprising a silicon/carbon alloy in drain and source regions wherein the first transistor comprises a channel region exhibiting a first strain component along a channel length direction. The semiconductor device further comprises a second transistor comprising a silicon/carbon alloy in drain and source regions thereof, wherein the second transistor comprises a channel region exhibiting a second strain component along a channel length direction wherein the first and second strain components are of opposite type.

BRIEF DESCRIPTION OF THE DRAWINGS

The disclosure may be understood by reference to the following description taken in conjunction with the accompanying drawings, in which like reference numerals identify like elements, and in which.

Figure 1A:
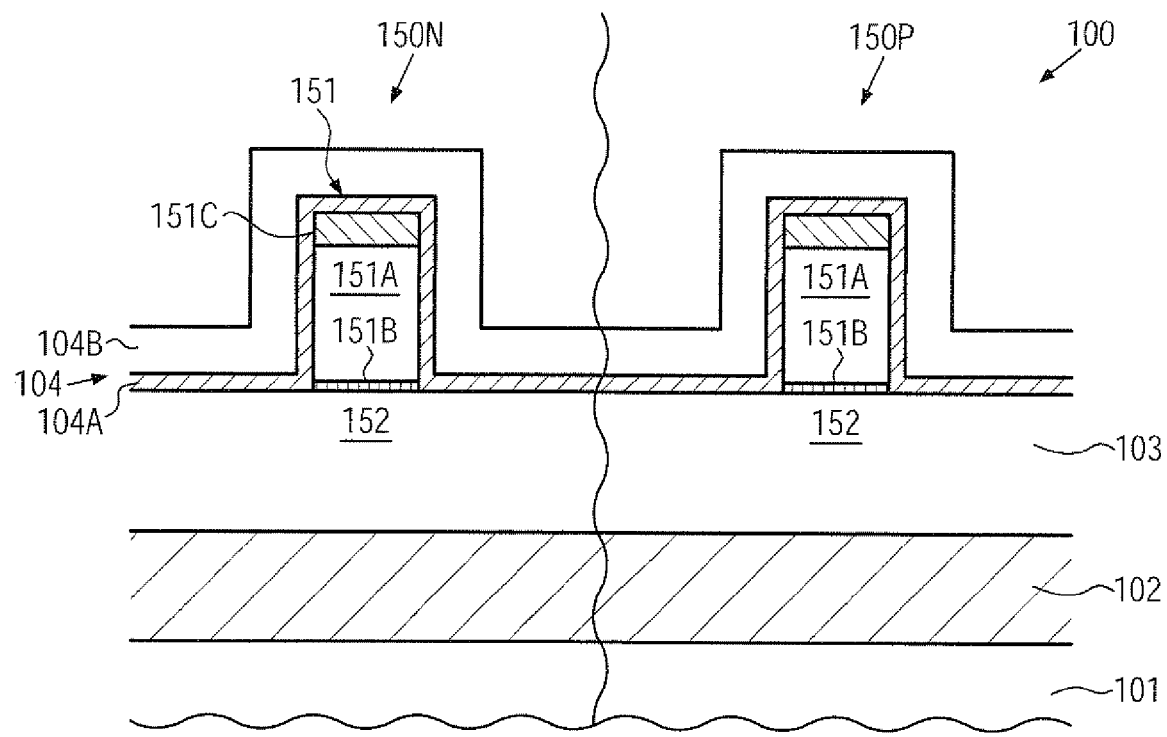
FIGS. 1a-1k schematically illustrate cross-sectional views of a semiconductor device including transistors of different conductivity type during various manufacturing stages, wherein a different type of strained semiconductor materials may be provided on the basis of a sophisticated manufacturing flow including enhanced masking regimes, possibly in combination with the incorporation of dopant species, non-doping species and the like, for enhancing overall transistor characteristics, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to manufacturing techniques and related semiconductor devices in which field effect transistors of different conductivity type may receive a strained semiconductor material in the drain and/or source regions in order to provide a desired magnitude and/or type of strain in the corresponding channel regions of these transistors. For this purpose, in some illustrative embodiments, different semiconductor alloys may be used, such as silicon/germanium and silicon/carbon, on the basis of an appropriate manufacturing regime in which both materials may be embedded into the drain and source areas of the corresponding transistors by using an appropriately designed layer stack including a spacer layer and an etch stop layer. Furthermore, overall transistor performance for at least one type of transistor may be enhanced by incorporating any desired type of implantation species, such as dopants, non-doping species and the like, prior to forming a respective strained semiconductor material by epitaxial growth techniques. In this case, the electronic characteristics of the drain and source regions may be enhanced on the basis of the additional implantation species, which may be incorporated without creating additional implantation-induced damage, since the implantation process may be performed prior to growing the strained semiconductor material. Consequently, for N-channel transistors, a reduced source/drain junction resistance may be obtained due to a specifically optimized dopant profile. Furthermore, floating body effects in silicon-on-insulator (SOI) transistors may be reduced due to the presence of higher leakage currents of the corresponding PN junctions, which may, therefore, reduce charge carrier accumulation in the body region of the SOI transistors. A corresponding adjustment of the PN junction characteristics may also be accomplished by incorporating an appropriate implantation species prior to actually forming the strained semiconductor material. Additionally, the electron mobility may be enhanced due to the embedded silicon/carbon alloy in the drain and source areas of the N-channel transistor. Similarly, in P-channel transistors, a reduced source and drain resistance may be obtained due to the lower intrinsic resistivity of the silicon/germanium material, and also leakage currents through the PN junctions may be adjusted to a moderately high value, depending on the overall transistor characteristics, thereby also reducing charge carrier accumulation in SOI transistors. Finally, the increased hole mobility in the channel region caused by the embedded silicon/germanium alloy may additionally contribute to the overall enhanced device performance. Furthermore, since both strain-inducing semiconductor materials may be incorporated at a moderately early manufacturing stage, additional strain-inducing mechanisms may be implemented into the overall manufacturing flow substantially without requiring additional process steps. For example, strain-inducing spacer elements and/or strain-inducing dielectric cap layers may be provided in order to further enhance strain in at least one type of transistor.

In other illustrative embodiments disclosed herein, a highly efficient manufacturing sequence may be used in incorporating a silicon/carbon material into transistors of different conductivity type, wherein additional strain-inducing mechanisms may also be used, for instance, in the P-channel transistor to overcompensate for any negative effect of the silicon/carbon material, while at the same time taking advantage of the characteristics of carbon with respect to acting as a diffusion hindering species, which may thus provide dopant profiles of enhanced accuracy in the P-channel transistor. Consequently, in combination with the enhanced electronic characteristics of the drain and source regions of the P-channel transistor and the overcompensated strain component, a significant enhancement of the P-channel transistor may be achieved, wherein, for SOI architectures, reduced floating body effects may also be achieved, while the N-channel transistor may exhibit reduced source/drain junction resistance in combination with increased electron mobility in the channel region due to the embedded silicon/carbon alloy. Also, in this case, charge carrier accumulation in the floating body of SOI N-channel transistors may be reduced by providing PN junctions of increased leakage currents due to the presence of the carbon species.

FIG. 1a schematically illustrates a cross-sectional view of a semiconductor device 100, which may comprise a first transistor 150P and a second transistor 150N at an early manufacturing stage. The semiconductor device 100 may comprise a substrate 101, which may represent any appropriate carrier material for forming thereabove a semiconductor layer 103, such as a silicon-based layer, the electronic characteristics of which may be locally adapted by generating a specific type of strain for the first and second transistors 150P, 150N. The semiconductor layer 103 may represent a silicon-based layer, i.e., a semiconductor material including a significant amount of silicon, wherein other components, such as germanium, carbon, dopant species and the like, may also be present. Furthermore, in the embodiment shown, a buried insulating layer 102 may be positioned between the substrate 101 and the semiconductor layer 103, thereby defining an SOI architecture, wherein it should be appreciated that, in other device areas of the device 100, a bulk configuration may be provided, depending on the overall device requirements. It should be noted that the principles disclosed herein may be very advantageous with respect to an SOI architecture, since efficient strain-inducing mechanisms may be provided in combination with additional measures for reducing charge carrier accumulation, which may generally improve performance of SOI transistors with respect to floating body effects and hysteresis effects, i.e., a threshold variation depending on the "switching history" of a corresponding transistor element. In other illustrative embodiments, the principles disclosed herein may also be advantageously applied to a bulk configuration, i.e., a configuration in which a thickness of the semiconductor layer 103 may be greater than a depth of drain and source regions still to be formed in the transistors 150P, 150N.

Furthermore, appropriate active regions may be defined in the semiconductor layer 103 on the basis of appropriate isolation structures, such as shallow trench isolations (not shown), which may also be provided between the transistors 150P, 150N. Furthermore, the transistors 150P, 150N may comprise a gate electrode structure 151 which may include, in this manufacturing stage, an electrode material 151A, which is formed on a gate insulation layer 151B, which separates the electrode material 151A from a channel region 152. The gate electrode material 151A may represent any appropriate material, such as polysilicon and the like, which may even be replaced by a material of enhanced conductivity in a later manufacturing stage, depending on the overall process and device requirements. Similarly, the gate insulation layer 151B may be comprised of any appropriate dielectric material, such as silicon dioxide-based materials, silicon nitride, silicon oxynitride, high-k dielectric materials, such as hafnium oxide, zirconium oxide and the like. Furthermore, the gate electrode structures 151 may include a cap layer 151C which may be comprised of silicon nitride and the like. Furthermore, the semiconductor device 100 may comprise a layer stack 104 that is formed above the transistors 150P, 150N and, in the embodiment shown, may comprise a first layer or spacer layer 104A, above which may be provided a second layer or etch stop layer 104B. In one illustrative embodiment, the spacer layer 104A may be comprised of silicon nitride while the etch stop layer 104B may be formed of silicon dioxide. Thus, in the embodiment shown, the spacer layer 104A and the cap layer 151C may be comprised of material having similar characteristics with respect to a subsequent etch process so that these components may be removed during a common etch sequence. Furthermore, the etch stop layer 104B may have a thickness that is sufficient to provide the desired etch stop capabilities during an etch process for locally providing an etch and growth mask above the transistor 150N. For example, the etch stop layer 104B may be provided with a thickness of approximately 20-50 nm or even more, when provided in the form of a silicon dioxide material. On the other hand, the spacer layer 104A may be provided with an appropriate thickness in a highly conformal manner in order to adjust a desired offset during an etch process for forming cavities in the semiconductor layer 103 in a later manufacturing stage. For instance, a thickness of the spacer layer 104A may range from approximately 1-20 nm in sophisticated applications in which a gate length, i.e., the horizontal extension of the gate electrode material 151A in FIG. 1*a*, may be approximately 50 nm and less, such as 30 nm and less. It should be appreciated, however, that an increased thickness may be selected if an increased offset may be required during the further processing.

The semiconductor device 100 as shown in FIG. 1*a* may be formed on the basis of the following processes. After forming respective isolation structures (not shown) and defining corresponding basic dopant profiles for the transistors 150P, 150N in the semiconductor layer 103, the gate electrode structure 151 may be formed by well-established techniques, which may include oxidation and/or deposition of a gate dielectric material followed by the deposition of the gate electrode material 151A and material of the cap layer 151C. The corresponding material stack may be patterned by sophisticated lithography and etch techniques. Next, the stack 104 may be formed, for instance, by depositing the spacer layer 104A, for instance using thermally activated chemical vapor deposition (CVD) techniques, wherein, if required, a thin oxide layer may be formed by oxidation on exposed areas of the gate electrode material 151A and the semiconductor layer 103. Thereafter, the etch stop layer 104B may be formed, by instance, by CVD and the like, wherein material density and thickness of the etch stop layer 104B may be selected such that the desired etch stop capabilities may be obtained. Thereafter, a mask material (not shown) may be deposited, for instance by plasma assisted CVD, thermally activated CVD and the like, which may be subsequently patterned by photolithography and appropriate selective etch techniques.

Figure 1B:
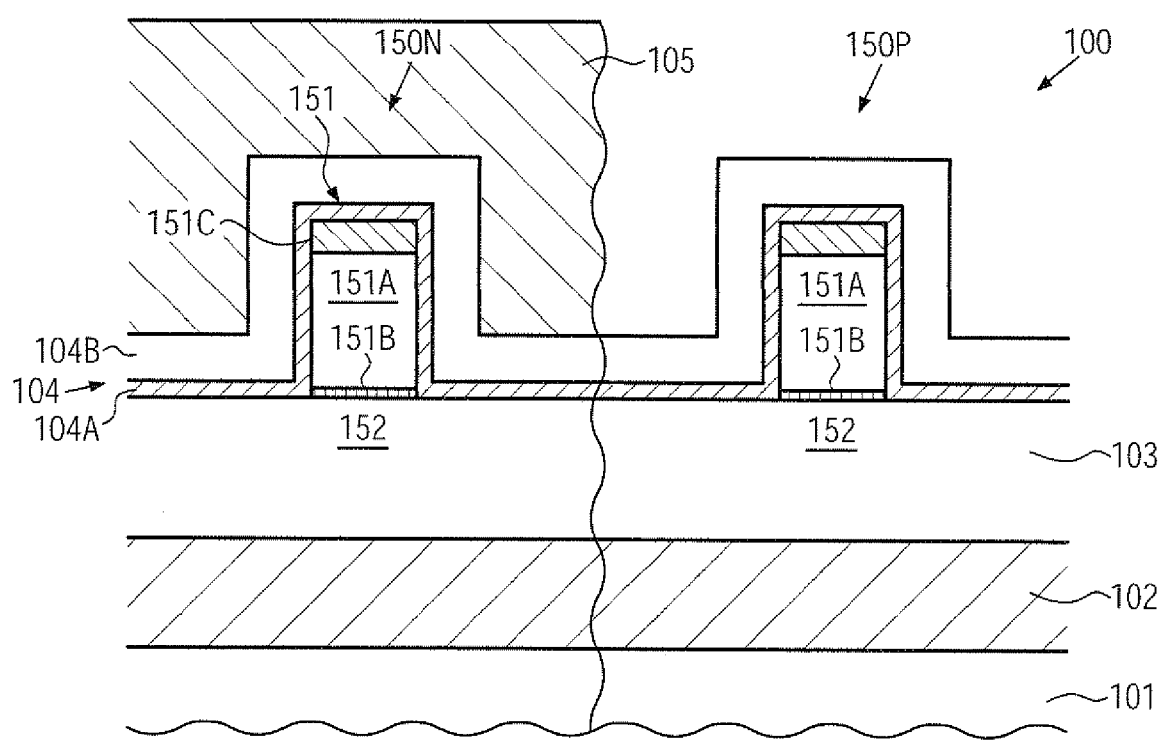

FIG. 1*b* schematically illustrates the semiconductor device 100 with a mask 105 that covers the second transistor 150N while exposing the first transistor 150P, i.e., the layer stack 104 formed thereabove. The mask 105 may represent, in one illustrative embodiment, a hard mask, for instance comprised of silicon nitride or any other appropriate material, which may be etched selectively to the etch stop layer 104B. In other illustrative embodiments, any other appropriate material, such as a resist material, may be selectively formed above the second transistor 150N and may be used for patterning the layer stack 104 in the first transistor 150P.

Figure 1C:
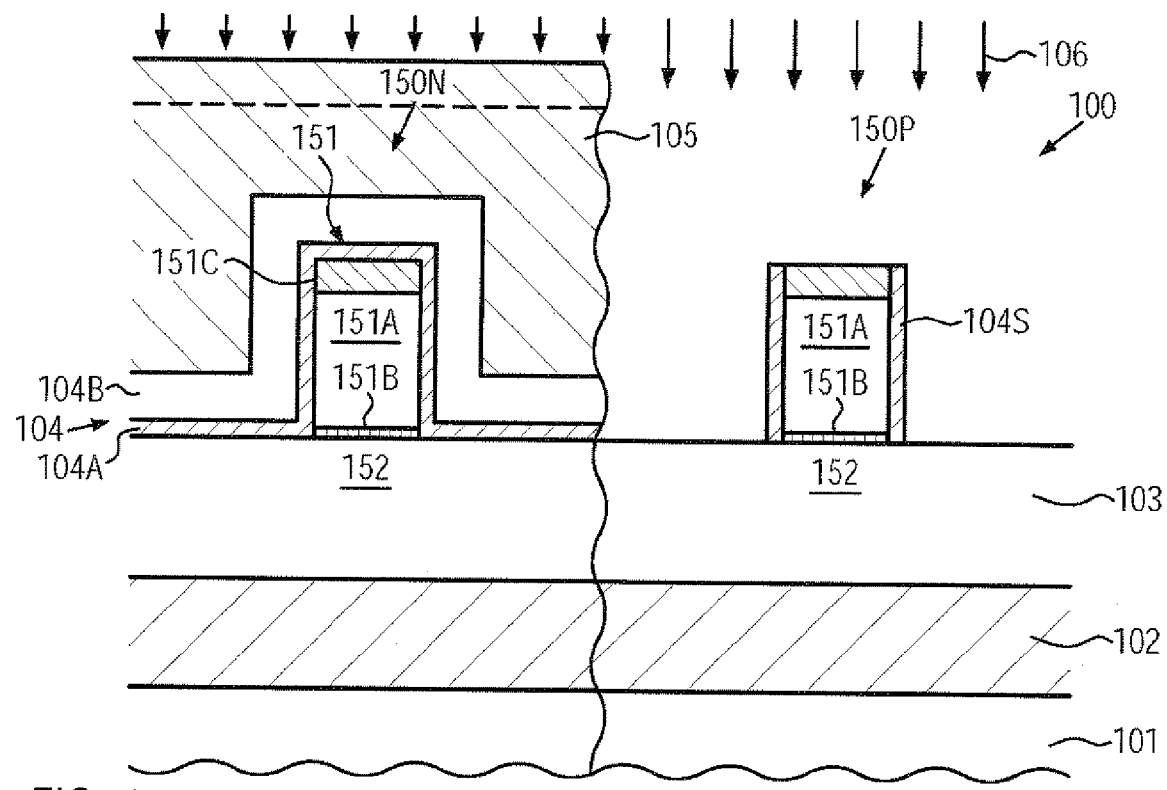

FIG. 1*c* schematically illustrates the semiconductor device 100 during an etch sequence 106, which may comprise a first etch step for selectively removing the etch stop layer 104B, which may be accomplished on the basis of well-established etch techniques, for instance by using hydrofluoric acid (HF), and thereafter an anisotropic etch step may be performed to etch the spacer layer 104A selectively to material of the semiconductor layer 103, while, in other cases, a thin oxide layer (not shown) may be provided to act as an etch stop material during the anisotropic etch process. Hence, after the etch process 106, a sidewall spacer 104S may be formed on sidewalls of the gate electrode structure 151, wherein a width of the spacer 104S is substantially determined by the initial layer thickness of the spacer layer 104A and the conditions of the etch sequence 106. In the embodiment shown, a certain degree of material erosion may also occur in the mask 105, as indicated by the dashed line, if the spacer layer 104A and the mask 105 are comprised of materials having a similar etch behavior or may be comprised of substantially the same material. In other illustrative embodiments, the mask 105 may represent a resist material, at least during the first etch step of the sequence 106 for selectively removing the etch stop layer 104B above the first transistor 150P. Thereafter, if required, the resist mask may be removed and the anisotropic etch step of the sequence 106 may be performed on the basis of a selective etch recipe, wherein the etch stop layer 104B may protect the remaining portion of the layer 104A above the second transistor 150N.

Figure 1D:
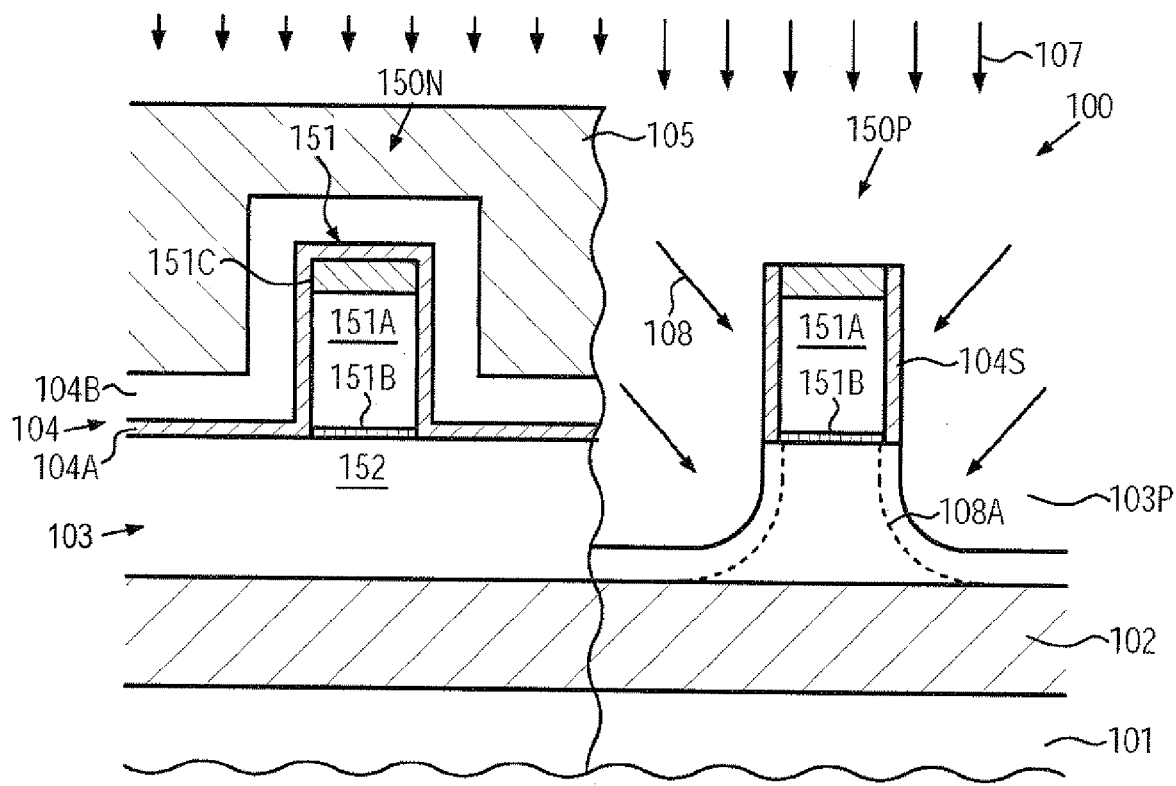

FIG. 1*d* schematically illustrates the semiconductor device 100 in a further advanced manufacturing stage, in which a further etch process 107 may be performed to obtain recesses or cavities 103P adjacent to the gate electrode structure 151 in the semiconductor layer 103 of the first transistor 150P. The etch process 107 may be performed on the basis of well-established etch recipes, such as isotropic recipes, anisotropic recipes or a combination thereof, depending on the desired shape and size of the cavities 103P. For example, a plurality of etch chemistries are available for removing silicon material selectively with respect to silicon nitride material, oxide material and the like which may be used for forming the cavities 103P. During the etch process 107, respective process parameters, such as plasma power, pressure, the type and amount of polymer materials for controlling a horizontal removal rate and the like, may be selected such that a desired shape of the cavities 103P may be obtained. For example, an offset of the cavities 103P from the channel region 152 may be substantially determined by the width of the spacer 104S. If a more or less pronounced degree of under-etching may be desired, the process parameters and/or the etch chemistry may be appropriately selected, for example, from the beginning of the etch process 107 or at a certain phase of the process, depending on the desired overall size and shape of the cavities 103P. In the embodiment shown, the mask 105 may protect the layer stack 104 formed above the second transistor 150N. In other cases, the mask 105 may have been removed in an earlier manufacturing stage, if provided as a resist material and the like, so that, in this case, the etch stop layer 104B may reliably protect the spacer layer 104A.

In some illustrative embodiments, after the etch process 107 and prior to or after the removal of the mask 105, one or more implantation processes 108 may be performed to incorporate one or more implantation species 108A through exposed surface portions of the cavity 103P. For example, the one or more implantation processes 108 may comprise one or more steps performed on the basis of a non-zero tilt angle, which is to be understood as a non-zero angle with respect to a normal of the semiconductor layer 103 or the buried insulating layer 102. Consequently, any desired implantation species may be incorporated, wherein the positioning of the implantation species 108A may be controlled by the process parameters of the one or more implantation processes 108, such as energy, dose, tilt angle, type of implantation species and the like. In some illustrative embodiments, the implantation species 108A may comprise a dopant species, for instance for counter-doping material of the layer 103 with respect to drain and source areas to be formed in a later manufacturing stage on the basis of a strained semiconductor material to be filled into the cavities 103P. Moreover, in other illustrative embodiments, the implantation species 108A may comprise a dopant for defining at least a portion of drain and source regions, such as an extension region to avoid additional implantation steps in a later manufacturing stage after providing a strained semiconductor material in the cavities 103P. In other illustrative embodiments, respective drain and source extension regions may have been formed in an early manufacturing stage, for instance prior to or after the deposition of the spacer layer 104A, depending on the initial layer thickness thereof. In still other illustrative embodiments, the implantation species 108A may comprise corresponding components, such as nitrogen, carbon and the like, which may result in a reduced diffusion activity of a corresponding dopant species, such as boron, which may be provided in a later manufacturing stage. In this manner, the finally obtained PN junctions of the drain and source regions may be defined with enhanced accuracy on the basis of one or more components of the implantation species 108A. Moreover, the degree of leakage currents through the PN junctions still to be formed may also be adjusted on the basis of the implantation species 108A, thereby enabling a highly efficient stabilization of threshold voltage of the transistor 150P with respect to floating body effects. During the implantation process 108, undue incorporation of the implantation species 108A into the gate electrode material 151A may be suppressed or at least reduced by the spacers 104S and the cap layer 151C. In other embodiments, in which the mask 105 may have been removed at an earlier manufacturing stage, the corresponding shadowing effect during a tilted implantation step of the process 108 may be reduced.

Figure 1E:
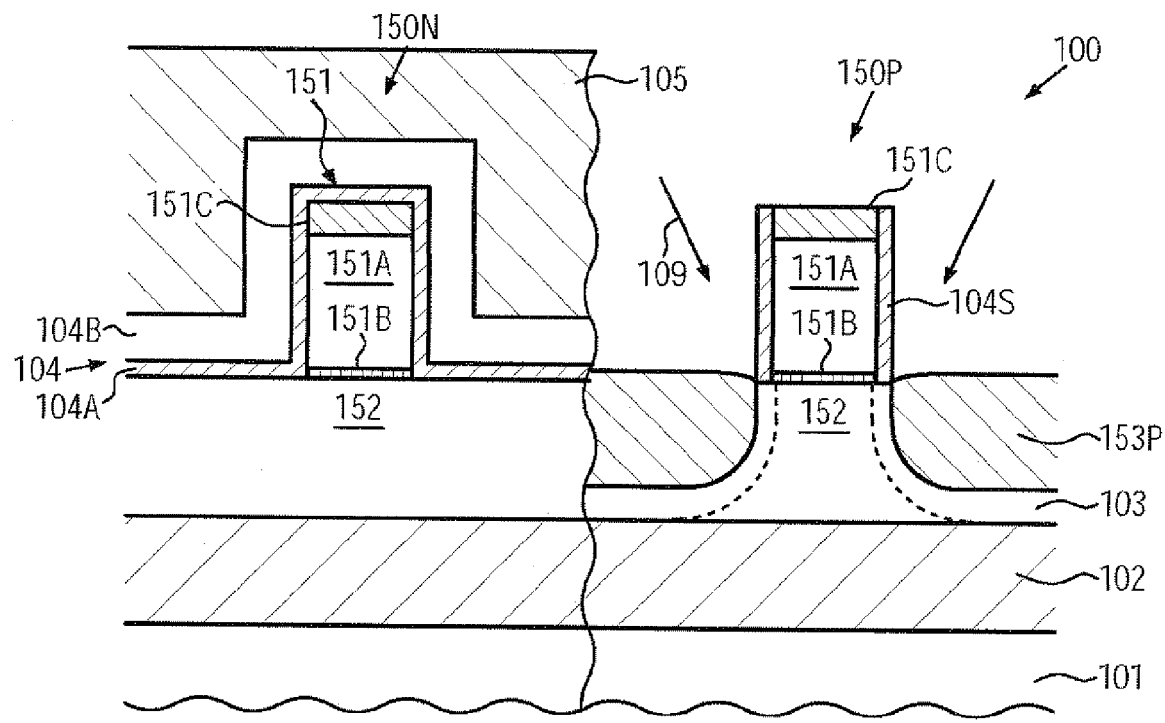

FIG. 1e schematically illustrates the semiconductor device 100 during a selective epitaxial growth process 109, which may be performed on the basis of well-established process recipes in order to deposit a semiconductor alloy selectively on exposed surfaces of the cavities 103P (FIG. 1d) while substantially avoiding significant material deposition on dielectric surface areas. For example, during the growth process 109, silicon/germanium may be deposited with a desired fraction of germanium so that, upon growing on the silicon layer 103, a strained state may be obtained, the magnitude of which may be determined on the fraction of germanium. For example, approximately 15-35 atomic percent germanium may be incorporated into the silicon/germanium alloy in order to form a strained semiconductor material 153P. It should be appreciated that, in other illustrative embodiments, in addition or alternatively to germanium, other atomic species having a greater covalent radius compared to silicon may be used, such as tin, which may also be incorporated into the material 153P. In this case, a significantly reduced fraction of non-silicon material may be incorporated, while nevertheless providing a desired difference of the natural lattice constant of the material 153P with respect to the surrounding template material of the layer 103. In some illustrative embodiments, during the growth process 109, a dopant species may also be incorporated into the material 153P, such as boron, so that further implantation processes may be avoided or may at least be reduced with respect to the implantation dose, thereby also maintaining implantation-induced damage of the material 153P at a low level. Thereafter, the further processing may be continued by removing the mask 105, which may be accomplished by well-established selective etch recipes, for instance using hot phosphoric acid, thereby efficiently removing the mask 105 when comprised of silicon nitride, selectively to the etch stop layer 104B, while also removing the spacers 104S and the cap layer 151C in the transistor 150P.

Figure 1F:
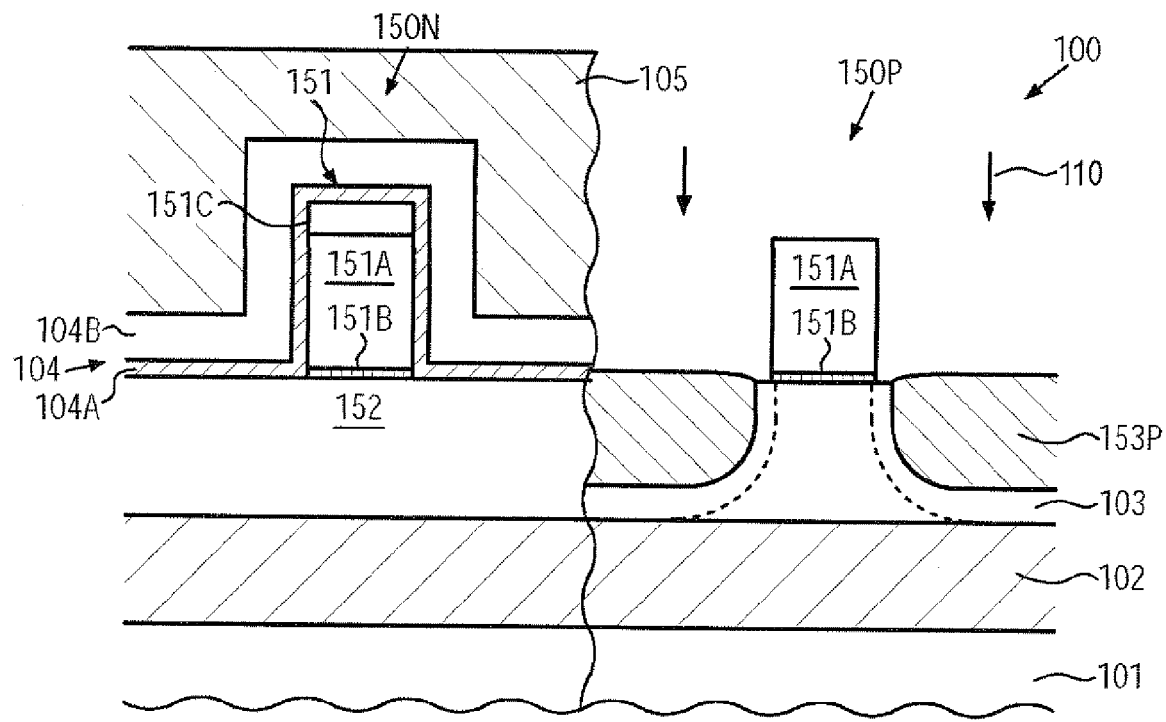

FIG. 1f schematically illustrates the semiconductor device 100 after the above-described process sequence. Moreover, the device 100 is exposed to an etch ambient 110 designed to selectively remove the exposed etch stop layer 104B, while maintaining the spacer layer 104A. For this purpose, well-established selective etch recipes, for instance on the basis of hydrofluoric acid (HF), may be used. Thereafter, a further etch process may be performed in order to anisotropically etch the exposed spacer layer 104A, as is also explained with reference to the etch process 106 (FIG. 1c).

Figure 1G:
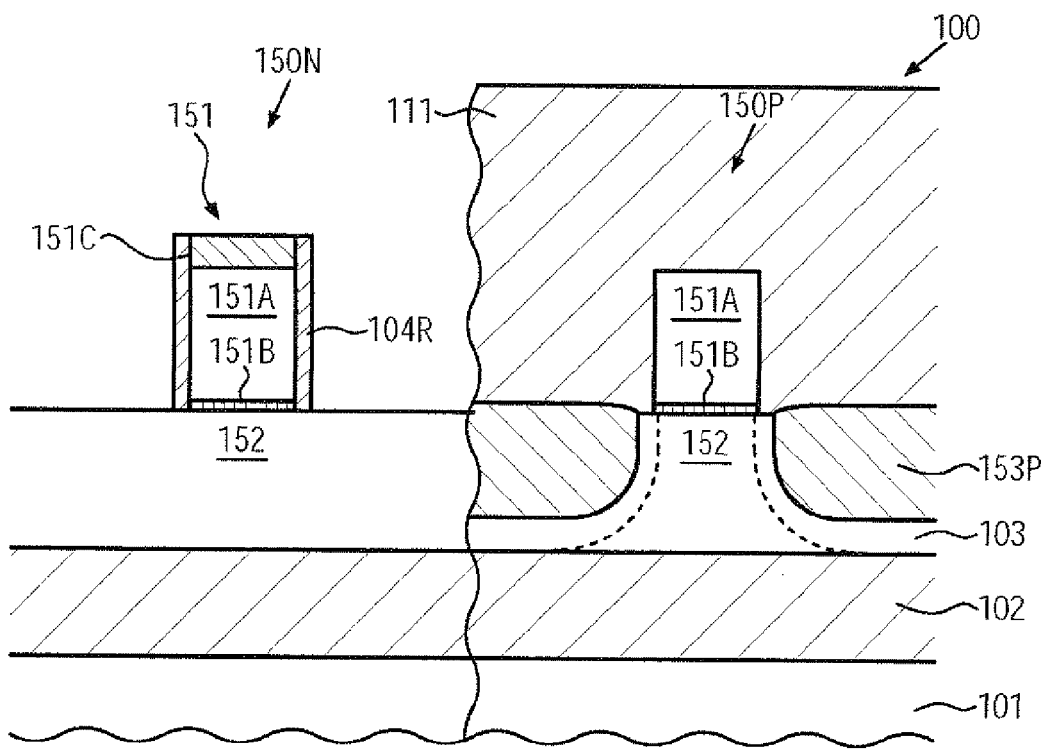

FIG. 1g schematically illustrates the semiconductor device 100 after the above-described process sequence and with a further mask 111 that covers the first transistor 150P, while the second transistor 150N has the gate electrode structure 151 that now comprises spacer elements 104R due to the previously performed anisotropic etch process. The mask 111 may be comprised of silicon nitride or any other material that is compatible with the further processing.

Figure 1H:
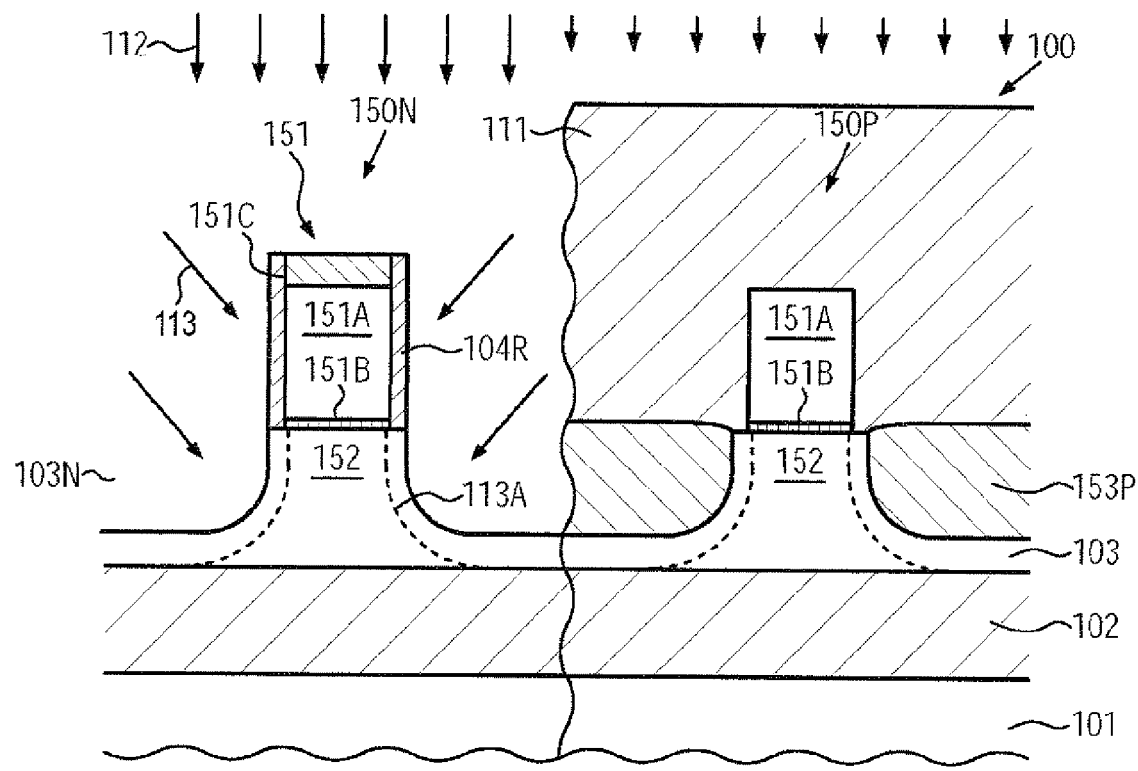

FIG. 1h schematically illustrates the semiconductor device 100 during an etch process 112, which may be performed on the basis of similar process parameters as the etch process 107 (FIG. 1d). That is, process parameters and etch chemistries of the etch process 112 may be selected in accordance with a desired size and shape of cavities 103N created adjacent to the gate electrode structure 151, wherein the spacers 104R protect the sidewalls thereof and also define an offset of the cavities 103N with respect to the channel region 152, similarly as is discussed above when referring to the first transistor 150P. Consequently, the size and shape of the cavities 103N may be adjusted independently from a size and shape of the corresponding cavities 103P (FIG. 1d). Furthermore, in some illustrative embodiments, an implantation process or sequence 113 may be performed to incorporate one or more implantation species 113A through exposed surface portions of the cavities 103N. Also, in this case, the implantation process 113 may include one or more implantation steps with a non-zero tilt angle so as to appropriately position the one or more implantation species 113A. For instance, a counter-doped region may be formed, a dopant species may be incorporated or any other implantation species, such as non-doping species in the form of carbon, nitrogen and the like, may be incorporated to adjust the overall electronic characteristics, for instance in view of leakage currents and the like, as is also previously discussed with reference to the transistor 150P, wherein it should be appreciated that, due to the different conductivity type of the transistors 150N and 150P, the implantation process 113 may differ from the corresponding process 108 (FIG. 1d) with respect to implantation parameters and implantation species.

Figure 1I:
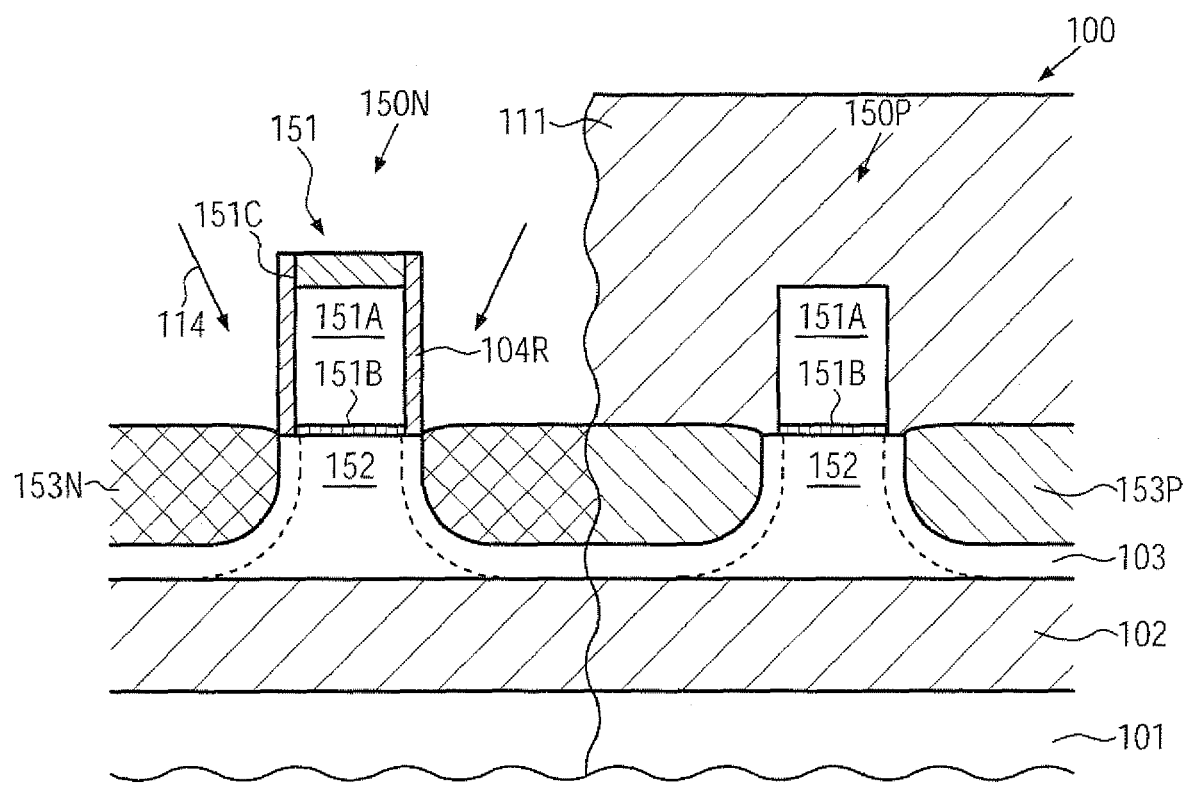

FIG. 1i schematically illustrates the semiconductor device 100 during a further selective epitaxial growth process 114 designed to deposit a strained semiconductor material 153N. In a further illustrative embodiment, the semiconductor material 153N may comprise a silicon/carbon alloy, which has a natural constant that is less than the lattice constant of silicon, thereby growing in a tensile strained state which may thus result in a tensile strain in the adjacent channel region 152. For example, an appropriate fraction of carbon material may be incorporated into the silicon material of the deposition ambient 114, for instance one to several atomic percent, depending on the desired degree of tensile stress and other electronic characteristics of drain and source regions to be formed in the second transistor 150N. Furthermore, as previously indicated, an appropriate dopant species, that is, an N-type species, may be incorporated into the material 153N during the growth process 114 so as to avoid further implantation processes or reduce at least the degree of ion bombardment during subsequent implantation processes for defining the finally desired dopant profile for the second transistor 150N. After the selective epitaxial growth process 114, an etch process, for instance on the basis of hot phosphoric acid and the like, may be performed in order to remove the mask 111 and the spacers 104R and the cap layer 151C.

Figure 1J:
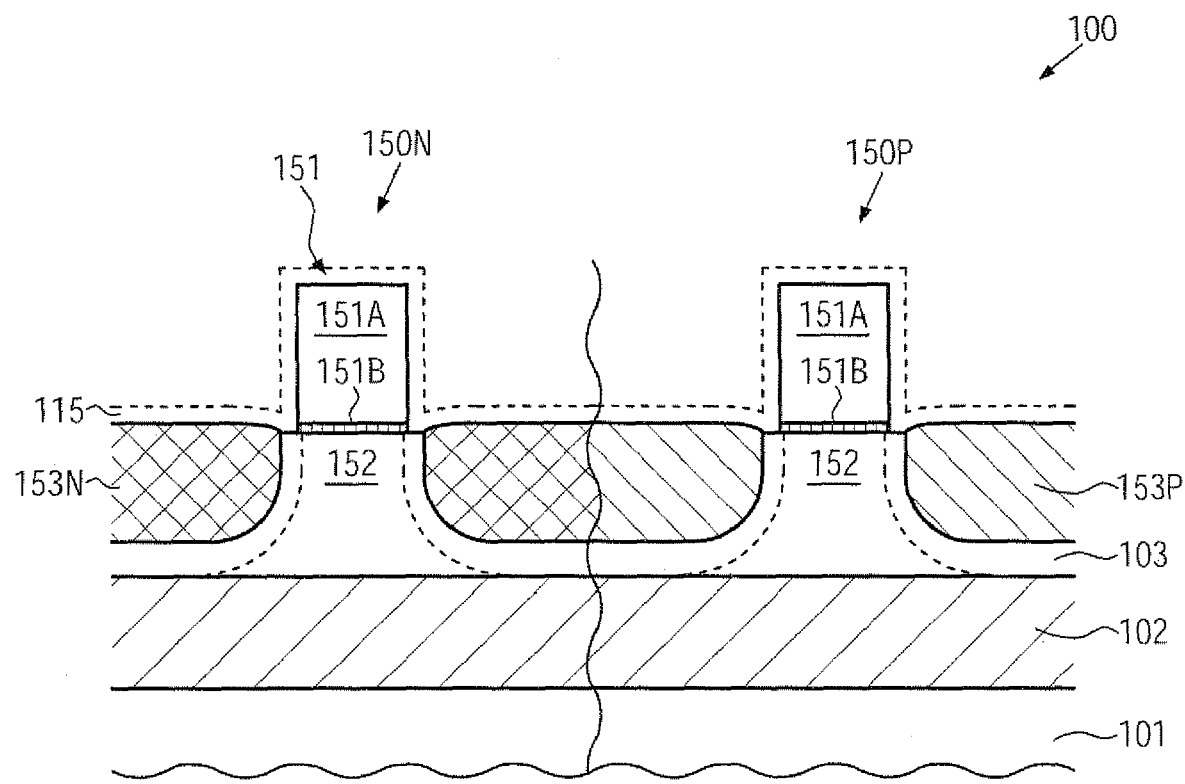

FIG. 1*j* schematically illustrates the semiconductor device 100 after the above-described process sequence. Hence, the gate electrode structures 151 of both transistors 150P, 150N may be exposed prior to the further processing of the device 100, while, in other embodiments, as indicated by the dashed line, a protection layer 115, such as a silicon dioxide layer and the like, may be provided prior to performing additional manufacturing processes for completing the transistors 150P, 150N.

Figure 1K:
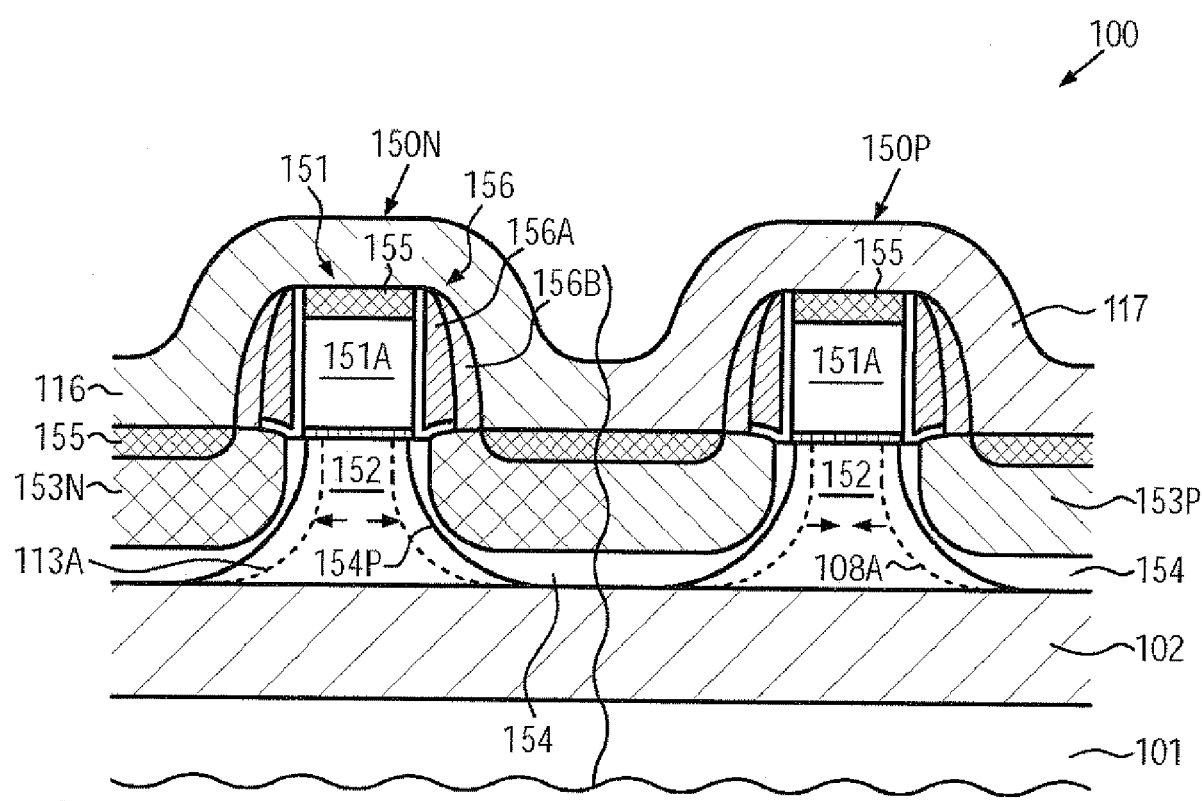

FIG. 1*k* schematically illustrates the semiconductor device 100 in a further advanced manufacturing stage. As illustrated, drain and source regions 154 may be formed adjacent to the channel region 152, wherein the drain and source regions 154 may comprise at least a portion of the strained semiconductor materials 153P, 153N, respectively. That is, depending on the device requirements, the strained materials 153N, 153P may be positioned entirely within the drain and source regions 154, as shown, which may be accomplished by incorporating a high concentration of the corresponding dopant species and performing an anneal process for initiating a diffusion of the dopant species. In other cases, a portion of the PN junctions 154P may extend through the strained semiconductor material, at least in one of the transistors 150P, 150N. It should be appreciated that, as previously discussed with reference to the implantation processes 108 (FIG. 1*d*) and 113 (FIG. 1*h*), the additional implant species 108A and/or 110A may be present so as to adjust the overall transistor characteristics, for instance in view of leakage of the PN junctions 154P, the dopant gradient, for instance by reducing the overall diffusivity of dopant species, such as boron, which may thus result in an enhanced confinement of the dopant species and thus of the drain and source regions 154 for the transistor 150P, which may represent a P-channel transistor.

Furthermore, the semiconductor device 100 may comprise a spacer structure 156 formed adjacent to the gate electrode material 151A, wherein the spacer structure 156 may comprise a plurality of individual spacer elements 156A, 156B, depending on the overall process and device requirements. For instance, the drain and source regions 154, at least for one of the transistors 150P, 150N, may be adjusted on the basis of additional implantation processes, during which the corresponding spacer elements 156A, 156B may act as implantation masks. In other illustrative embodiments, additional implantation processes may be substantially avoided after forming the strained semiconductor materials 153P, 153N, respectively, thereby also maintaining lattice damage in these materials at a low level. In this case, the spacer structure 156 may be provided to act as a mask for forming metal silicide regions 155 in a self-aligned manner. In some illustrative embodiments, the spacer structure 156 may comprise a high intrinsic stress level, which may be appropriate for enhancing performance of one of the transistors 150P, 150N. For example, the spacer structure 156 may have a high tensile stress level, thereby providing additional strain in the channel region 152 of the transistor 150N. On the other hand, a negative influence of the internal stress level in the transistor 150P may be overcompensated for by additional stress-inducing mechanisms, such as strain-inducing dielectric layers 116 and 117, which may be provided with high internal tensile stress and compressive stress, respectively. For instance, silicon nitride may be deposited with high internal stress levels, depending on the corresponding process parameters of a plasma enhanced CVD technique. For example, stress levels up to 1 GPa and higher for a tensile silicon nitride material may be obtained, while stress levels of up to 2 GPa and higher may be accomplished for a compressively stressed silicon nitride material. Consequently, by providing a high internal compressive stress level in the layer 117, any tensile internal stress of the spacer structure 156 in the transistor 150P may be compensated for. In other illustrative embodiments, a compressive stress level may be established in the spacer structures 156, when a further pronounced performance gain may be desired in the transistor 150P.

The semiconductor device 100 as shown in FIG. 1*k* may be formed on the basis of the following processes. The drain and source regions 154 may be formed, for instance, by ion implantation for forming shallow drain and source extension regions (not shown), wherein implantation-induced damage of the materials 153P, 153N may be less pronounced. In other cases, as previously discussed, corresponding extension regions may have been formed prior to growing the materials 153P, 153N, respectively. If required, further implantation processes may be performed to incorporate additional dopant species and/or the corresponding dopant species may have been incorporated during the growth processes for the materials 153P, 153N. Furthermore, appropriate anneal processes may be performed in order to establish the desired dopant profile for the drain and source regions 154, wherein also the corresponding implantation species 113A (FIG. 1*h*), 108A (FIG. 1*d*) may enable a more precise control of the finally obtained electronic characteristics. Thereafter, the metal silicide regions 155 may be formed in accordance with well-established techniques, wherein the spacer structure 156 may be used as a silicidation mask. Subsequently, the layers 116 and 117 may be deposited, wherein one or both of the layers may have a high intrinsic stress level, as explained above, which may be accomplished on the basis of respective patterning regimes in which one of the layers 116, 117 may be deposited and may subsequently be removed from above one of the transistors 150P, 150N, followed by the deposition of the other one of the layers 116, 117 and the removal thereof from the other one of the transistors 150P, 150N.

As a consequence, the strained semiconductor materials 153P, 153N may be formed on the basis of selective epitaxial growth techniques, wherein appropriate mask and etch stop layers, such as the layers 104A, 104B (FIG. 1*a*) may be used, possibly in combination with the incorporation of appropriate implantation species, such as species 113A (FIG. 1*h*), 108A (FIG. 1*d*), and may provide enhanced electronic characteristics and strain conditions, as is also previously explained.

With reference to FIGS. 2*a*-2*h*, embodiments will be described in which a strained semiconductor material of reduced natural lattice constant compared to silicon may be provided in transistors of different conductivity type to obtain performance enhancement of both types of transistors.

Figure 2A:
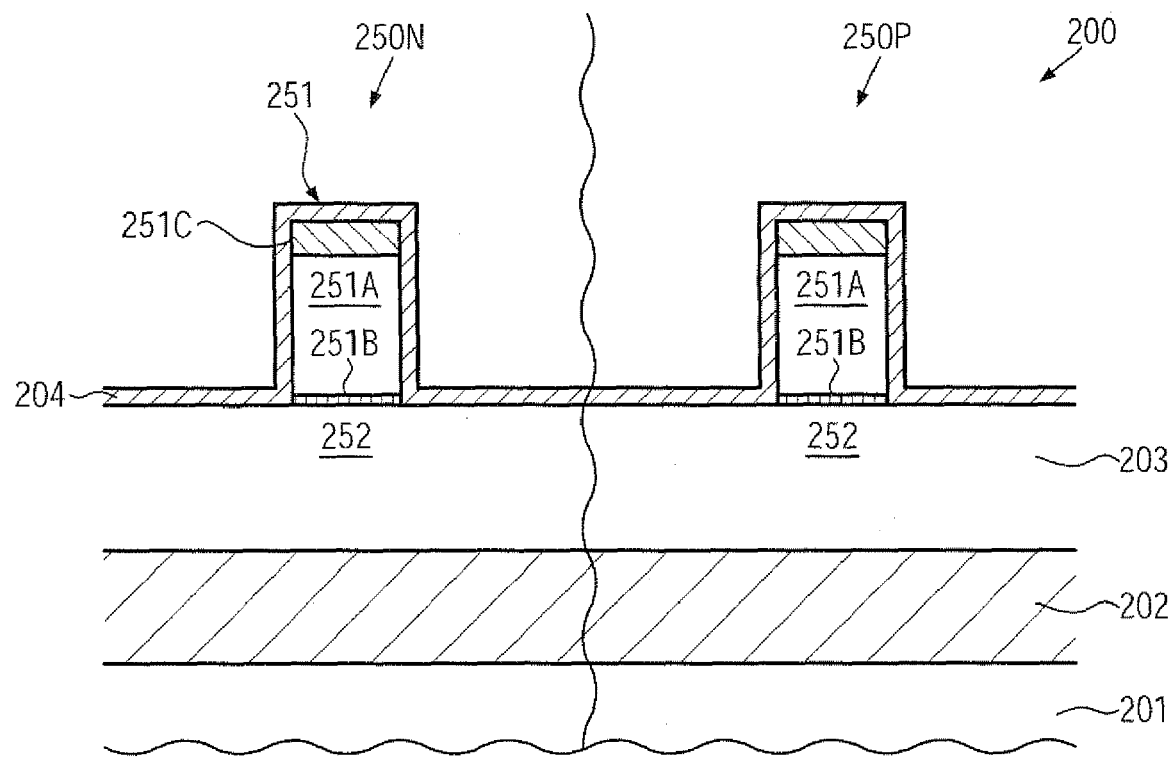
FIGS. 2a-2h schematically illustrate cross-sectional views of a semiconductor device during various manufacturing stages in forming transistor elements with different strain components by using a common semiconductor alloy, such as silicon/carbon, according to further illustrative embodiments.

FIG. 2a schematically illustrates a semiconductor device 200 comprising a substrate 201, a buried insulating layer 202 and a semiconductor layer 203. Furthermore, gate electrode structures 251 of a first transistor 250P and a second transistor 250N of different conductivity type are formed above the semiconductor layer 203. The gate electrode structures 251 may comprise a gate electrode material 251A, a gate insulation layer 251B and a cap layer 251C. With respect to the components described so far, the same criteria apply as previously explained with reference to the semiconductor device 100. Furthermore, a spacer layer 204 is formed on the gate electrode structures 251, wherein the spacer layer 204 may have an appropriate thickness for adjusting an offset of cavities to be formed in the layer 203 in a later manufacturing stage. The semiconductor device 200 as shown in FIG. 2a may be formed on the basis of the same process techniques as previously described with reference to the device 100.

Figure 2B:
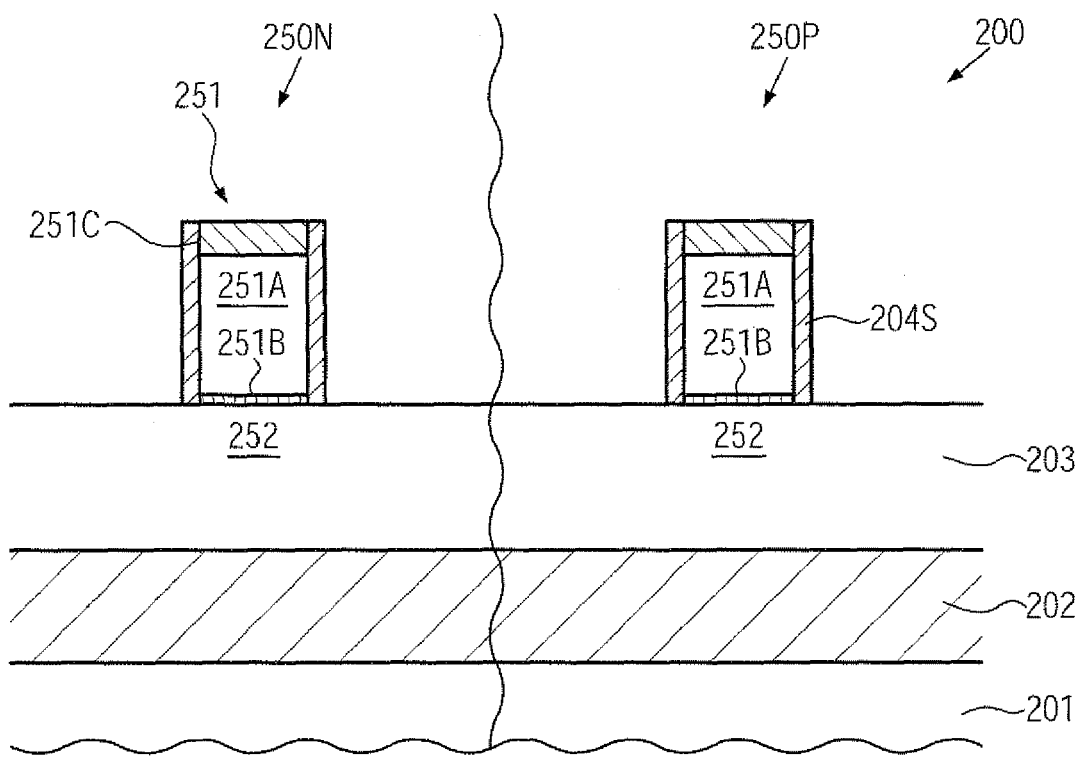

FIG. 2b schematically illustrates the semiconductor device 200 with spacer elements 204S formed on sidewalls of the gate electrode structures 251, which may be accomplished on the basis of well-established etch techniques, as previously explained, wherein, if required, a thin etch stop liner (not shown), for instance in the form of silicon dioxide, may be provided, for instance, by oxidation of exposed surface portions of the gate electrode material 251A and the semiconductor layer 203.

Figure 2C:
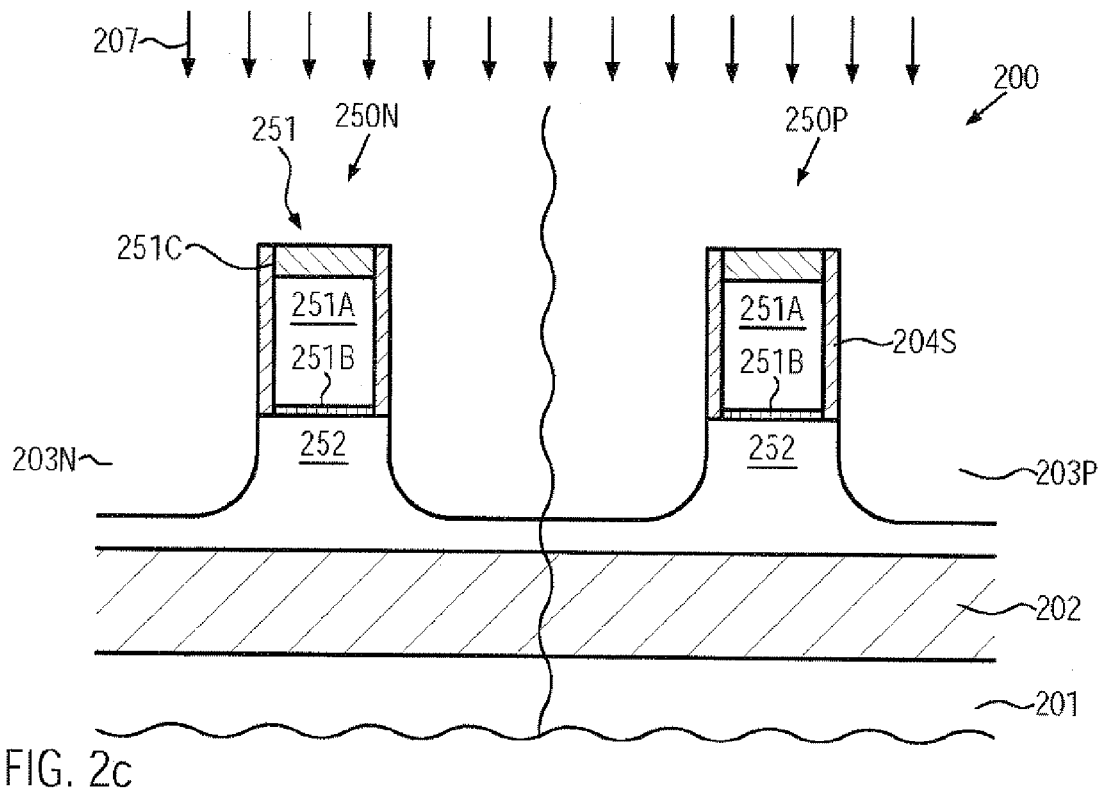

FIG. 2c schematically illustrates the semiconductor device 200 in a further advanced manufacturing stage. As illustrated, the device 200 is exposed to an etch ambient of an etch process 207 for forming cavities 203P and 203N in the transistors 250P, 250N, respectively. The etch process 207 may be performed on the basis of well-established etch chemistries exhibiting a moderately high selectively with respect to the material of the spacers 204S and the cap layer 251C so as to not unduly remove material of the gate electrode materials 251A. Since the etch process 207 may be performed simultaneously for the transistors 250P, 250N, generally the overall process uniformity may be enhanced due to the absence of etch masks. Consequently, the across-substrate uniformity, for instance with respect to a depth of the corresponding cavities 203P, 203N may be enhanced. Moreover, any additional lithography steps for individually providing the cavities 203P, 203N may be avoided. In some illustrative embodiments, starting from the device 200 as shown in FIG. 2a, the etch sequence for defining the spacers 204S and forming the cavities 203P, 203N may be performed as an in situ process, i.e., within the same process chamber, while appropriately adapting the etch chemistry during the various phases of the common etch process. After the etch process 207, the device 200 may be prepared for the deposition of a strain-inducing semiconductor material, which may include respective cleaning processes and the like.

Figure 2D:
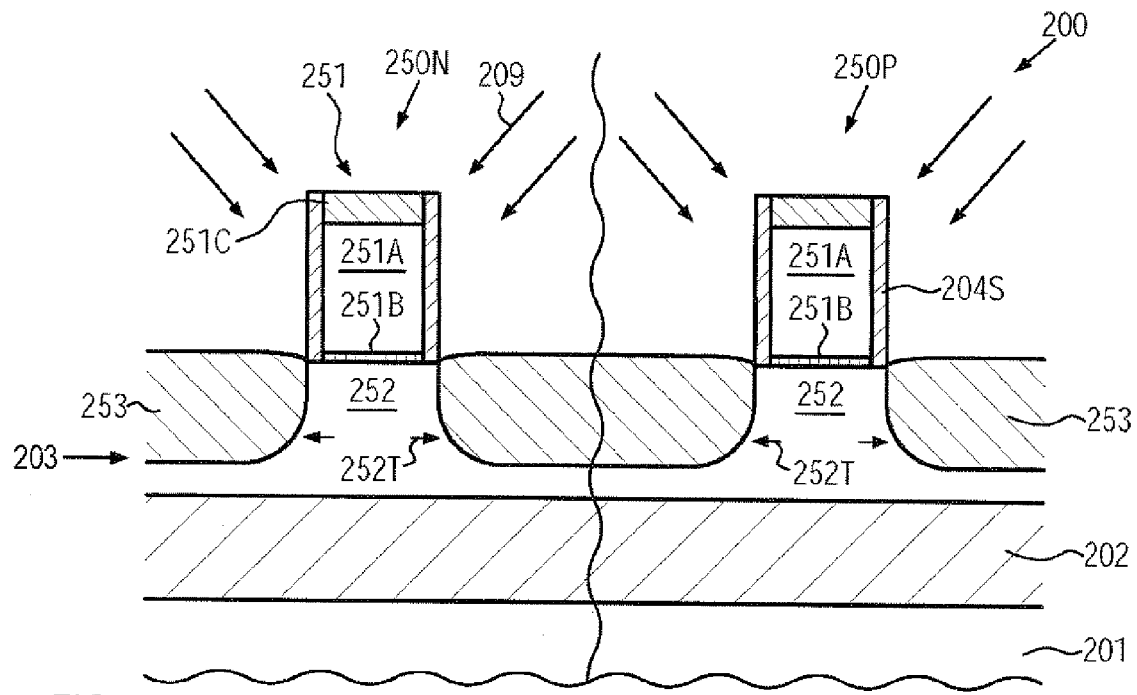

FIG. 2d schematically illustrates the semiconductor device 200 during a selective epitaxial growth process 209, which may be designed to deposit a semiconductor alloy 253, for instance in the form of a silicon/carbon alloy, which may be grown on the silicon-based template material of the layer 203 with a tensile strain level. With respect to corresponding process parameters of the process 209, similar criteria apply as previously explained with reference to the semiconductor device 100. It should be appreciated that, also during the selective epitaxial growth process 209, enhanced overall process uniformity may be achieved, due to the absence of extended mask regions, in which a deposition of the material 253 may not be desired. Furthermore, the material 253 may be deposited in a substantially non-doped state since the corresponding drain and source regions may require a different type of dopant species for the transistors 250P, 250N, respectively. Thus, a tensile strain component may be induced in channel regions 252 of transistors 250P, 250N, wherein the tensile strain component 252T may be directed along the channel length direction, that is, in FIG. 2d, the horizontal direction.

Figure 2E:
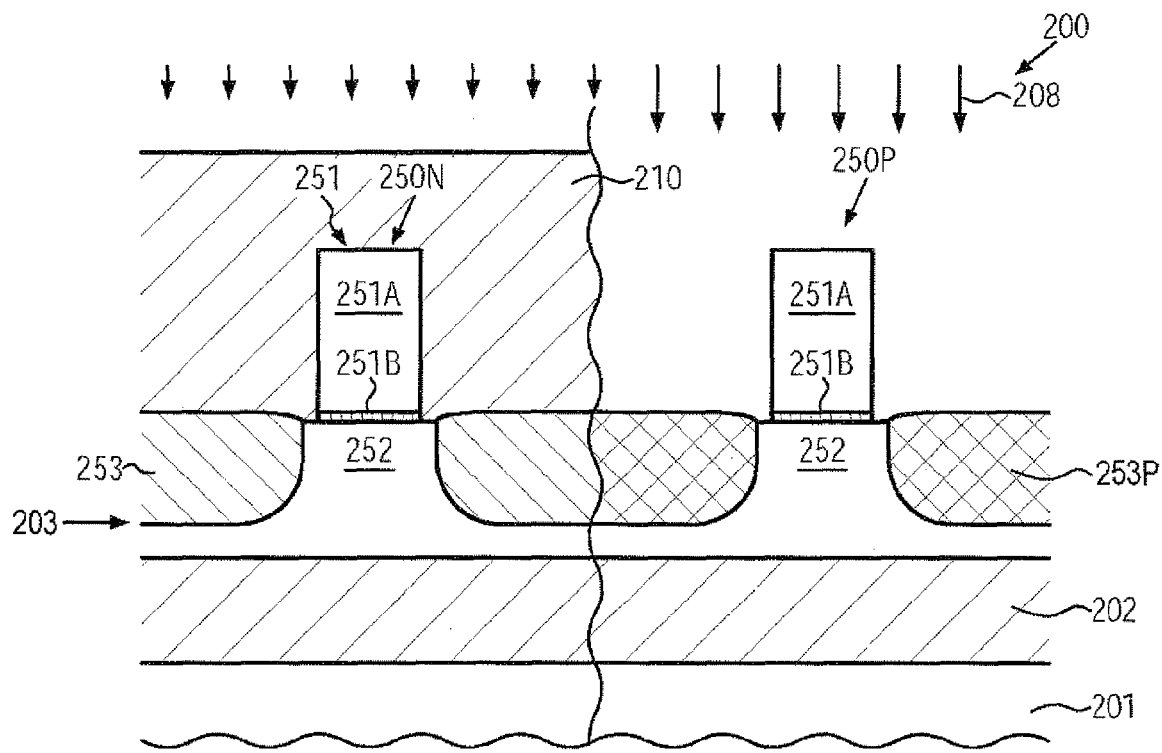

FIG. 2e schematically illustrates the semiconductor device 200 in a further advanced manufacturing stage. As shown, the device 200 may be exposed to an ion bombardment 208, wherein the second transistor 250N may be masked by an appropriate mask 210, such as a resist mask, while the transistor 250P is exposed. In some illustrative embodiments, as shown, the spacers 204S and the cap layers 251C may have been removed prior to forming the mask 210, while, in other cases, the gate electrode structures 251 may still be encapsulated by the spacers 204S and the cap layers 251C (not shown). Maintaining the cap layer 251C during the ion bombardment 208 may reduce the penetration of the corresponding species into the gate electrode material 251A, if deemed inappropriate. In the embodiment shown, the ion bombardment 208 may be performed with the spacers 204S removed, wherein, if desired, offset spacers of reduced width (not shown) may be provided on sidewalls of the gate electrode materials 251A. Consequently, during the ion bombardment 208, the crystalline structure of portions of the semiconductor layer 203 and of the previously grown semiconductor alloy 253 may be heavily damaged or substantially amorphized. For this purpose, any appropriate implantation species may be used, such as xenon, germanium, silicon, krypton and the like. It should be appreciated that appropriate implantation parameters for the bombardment 208 may readily be determined on the basis of well-established simulation programs, experiments and the like. Consequently, the material 253 may be relaxed, thereby forming a substantially relaxed semiconductor alloy 253P. In addition, the semiconductor material adjacent to the gate electrode material 251A may also be heavily damaged or amorphized, depending on a width of a corresponding offset spacer, if provided.

Figure 2F:
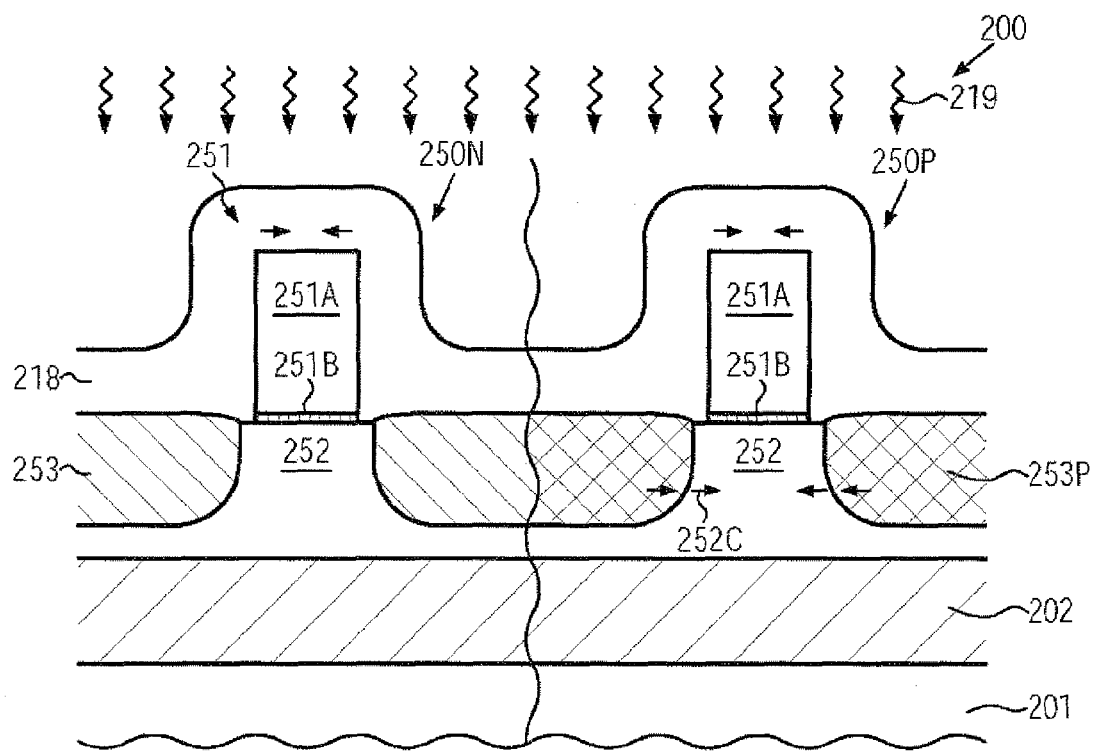

FIG. 2f schematically illustrates the semiconductor device 200 in a further advanced manufacturing stage. As illustrated, a stress-inducing material layer 218, for instance comprised of silicon nitride, nitrogen-containing silicon carbide and the like, may be formed above the first and second transistors 250P, 250N, which may have a high intrinsic compressive stress level of one or more GPa or even higher. For example, as previously explained with reference to the layers 116, 117 (FIG. 1k), silicon nitride material may be formed so as to have a high compressive stress level by selecting appropriate deposition parameters. Thus, the layer 218 may induce a moderately high compressive stress level in the previously relaxed material 253P and thus in the channel region 252 of the transistor 250P. Similarly, temporarily, the strain component in the channel region 252 of the transistor 250N may be compensated or even over-compensated by the stress-inducing layer 218. Furthermore, the device 200 is subjected to an anneal process 219 designed to re-crystallize the heavy lattice damage created in the material 253P and adjacent to the channel region 252 of the first transistor 250P. For example, any appropriate anneal technique, such as rapid thermal anneal, laser-based or flashlight-based anneal techniques, may be used in which an efficient re-crystallization may occur. Due to the presence of the highly stressed layer 218, the material 253P and any material of the layer 203 adjacent thereto may re-grow in a highly compressively stressed state, thereby preserving the compressive strain component in the channel region 252 of the first transistor 250P. It should be appreciated that, due to the strained state of the re-crystallized material 253P, the corresponding compressive strain component 252C may be maintained in the channel region 252, even after removal of the layer 218. Techniques in which a substantially amorphized semiconductor material may be re-grown in the presence of a stressed cap layer may frequently be referred to as stress memorization techniques.

Figure 2G:
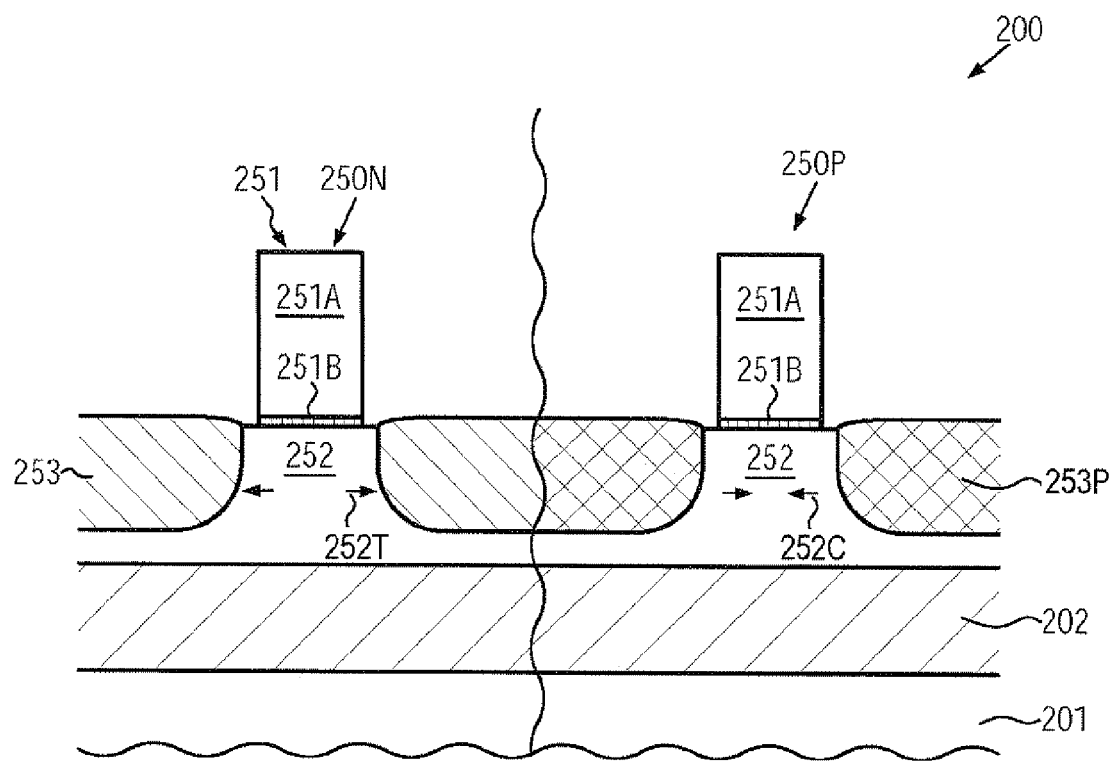

FIG. 2g schematically illustrates the semiconductor device 200 after the removal of the stress-inducing cap layer 218. It should be appreciated that an appropriate etch stop material may be provided along with the stress-inducing layer 218, if desired, in order to enhance the removal process. In other cases, the layer 218 may be removed on the basis of highly selective etch recipes, in which, for instance, silicon nitride material may be removed selectively with respect to silicon-based material. Consequently, in the transistor 250N, the tensile strain component 252T may be re-established due to the removal of the "external" strain-inducing source in the form of the layer 218, while the compressive strain component 252C in the transistor 250P may still be present due to the previously strained re-crystallization of the material 253P and material adjacent thereto, which may have also been amorphized during the process 208 (FIG. 2e). On the basis of the device configuration as shown in FIG. 2g, the further processing may be continued, for instance, by using well-established process techniques.

Figure 2H:
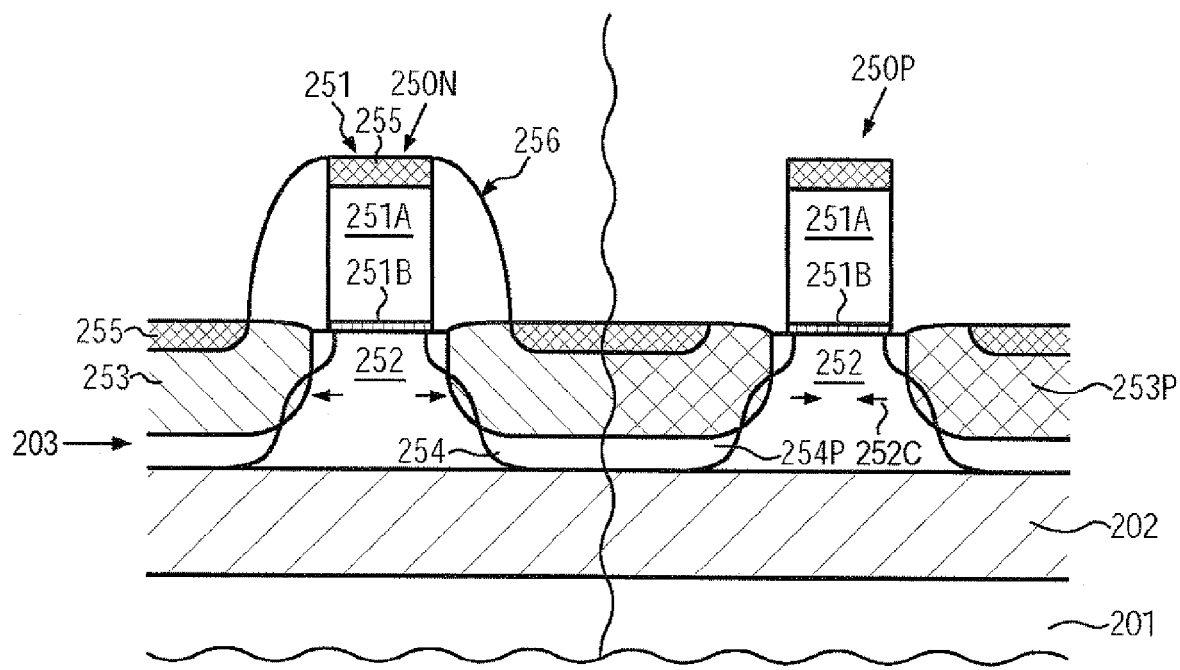

FIG. 2h schematically illustrates the semiconductor device 200 in a further advanced manufacturing stage in which drain and source regions 254 may be formed within the semiconductor layer 203, wherein at least a portion of the drain and source regions 254 may comprise the strain-inducing material 253 in the transistor 250N and the strain-inducing material 253P in the transistor 250P. Furthermore, a corresponding sidewall spacer structure 256 may be provided on sidewalls of the gate electrode structures 251, wherein, as is also previously explained with reference to the device 100, the spacer structure 256 may comprise any appropriate number of individual spacer elements in order to appropriately define the lateral and vertical dopant profile of the drain and source regions 254. Furthermore, metal silicide regions 255 may be formed in the drain and source regions and the gate electrode materials 251A.

The semiconductor device 200 as shown in FIG. 2h may be formed on the basis of well-established process techniques, wherein the drain and source regions 254 may be created on the basis of the spacer structure 256 by means of ion implantation. In the transistor 250P, typically boron may act as a dopant species, wherein, however, due to the presence of an additional species, such as carbon, in the material 253P, enhanced doping profiles may be obtained due to the diffusion hindering effect of the carbon species with respect to the boron species. That is, the PN junction at the transistor 250P, as indicated by 254P, may be defined in accordance with the corresponding implantation steps such that a significant length thereof may be within the semiconductor alloy 253P. Thus, upon annealing the device 200, the diffusion hindering effect of the carbon species may provide increased "confinement" of the boron species at least within the material 253P. Consequently, in addition to the compressive strain component 252C, the enhanced dopant gradient at the PN junction 254P, at least within the region 253P, may contribute to reduced junction resistance, which may also result in enhanced transistor performance. Furthermore, the presence of the carbon species in the transistors 250P, 250N may result in an increased leakage current of the respective PN junctions, which may thus provide an efficient mechanism for removing accumulated charges between the drain and source regions 254 during operation of the transistors 250P, 250N, as previously explained. Furthermore, as also previously explained with reference to the device 100, additional strain-inducing mechanisms may be implemented, for instance by providing highly stressed spacer elements in the spacer structure 256 and/or positioning stress-inducing layers, such as the layers 116, 117 (FIG. 1k) above the transistors 250P, 250N so as to further enhance the overall strain components in these transistors.

As a result, the present disclosure provides semiconductor devices and methods of forming the same in which strained semiconductor materials, such as silicon/germanium and the like on the one hand and silicon/carbon on the other hand, may be incorporated in the drain and source regions on the basis of a highly efficient manufacturing flow, possibly in combination with additional implant species for further enhancing the overall transistor characteristics so that dopant profiles in combination with increased strain levels may be accomplished. In other cases, a semiconductor material having a natural lattice constant less than a silicon-based material may be used in transistors of different conductivity types, wherein a negative influence of the corresponding initially provided strain component may be overcompensated for by applying a stress memorization technique. Consequently, enhanced overall process uniformity may be achieved due to enhanced conditions during etching the respective cavities and depositing the semiconductor alloy, while at the same time dopant profile characteristics as well as leakage current behavior may be enhanced in both the P-channel transistor and the N-channel transistor, thereby also contributing to enhanced overall device characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a spacer layer above a first gate electrode structure of a first transistor and a second gate electrode structure of a second transistor, said first gate electrode structure comprising a first cap layer and said second gate electrode structure comprising a second cap layer;

forming an etch stop layer above said spacer layer;

forming a first mask above said etch stop layer, said first mask covering said second transistor and exposing said first transistor;

after forming said first mask, removing said etch stop layer from above said first transistor;

after removing said etch stop layer from above said first transistor, forming a first sidewall spacer at sidewalls of said first gate electrode structure from said spacer layer, and thereafter forming first cavities in first drain and source areas of said first transistor using said first sidewall spacer and said first cap layer as a mask;

forming a first strained semiconductor material in said first cavities;

after forming said first strained semiconductor material, forming a second sidewall spacer at sidewalls of said second gate electrode structure from said spacer layer, and thereafter forming second cavities in second drain and source areas of said second transistor using said second sidewall spacer and said second cap layer as a mask; and forming a second strained semiconductor material having a different material composition than said first strained semiconductor material in said second cavities.

2. The method of claim 1, further comprising introducing one or more first implantation species into exposed surface portions of said first cavities.

3. The method of claim 2, wherein said one or more first implantation species comprises a non-doping species for modifying a diffusion behavior of a dopant species of drain and source regions of said first transistor.

4. The method of claim 2, wherein said one or more first implantation species comprises a dopant species for forming drain and source regions of said first transistor.

5. The method of claim 1, further comprising introducing one or more second implantation species into exposed surface portions of said second cavities.

6. The method of claim 5, wherein said one or more second implantation species comprises a non-doping species.

7. The method of claim 5, wherein said one or more second implantation species comprises a dopant species for forming drain and source regions of said second transistor.

8. The method of claim 5, wherein said first strained semiconductor material is formed by a first selective epitaxial growth process and said second strained semiconductor material is formed by a second epitaxial growth process.

9. The method of claim 1, further comprising forming one or more stress-inducing spacer elements on sidewalls of said first and second gate electrode structures after forming said first and second strained semiconductor materials.

10. The method of claim 1, further comprising forming a first strain inducing layer above said first transistor and forming a second strain inducing layer above said second transistor, wherein said first and second strain inducing layers induce a different type of strain in channel regions of said first and second transistors.

11. The method of claim 1, wherein said first strained semiconductor material comprises a silicon/germanium alloy and said second strained semiconductor material comprises a silicon/carbon alloy.

12. The method of claim 1, wherein removing said etch stop layer from above said first transistor comprises performing a first etch process, and wherein forming said first sidewall spacer comprises performing a second etch process.

13. The method of claim 12, wherein performing said second etch process comprises performing a substantially anisotropic etch process to remove portions of said spacer layer from above said first cap layer and from above said first drain and source areas.

14. The method of claim 1, further comprising removing said first cap layer and said first sidewall spacer from said first gate electrode structure prior to forming said second sidewall spacer.

15. The method of claim 1, wherein forming said second sidewall spacer comprises forming a second mask to cover said first transistor and to expose said second transistor and removing said etch stop layer from above said second transistor.

16. The method of claim 1, further comprising implanting at least one implantation species into an exposed surface portion of at least one of said first and second cavities prior to forming said respective strained semiconductor material.

17. A method, comprising:
forming a first gate electrode structure of a first transistor and a second gate electrode structure of a second transistor, said first gate electrode structure comprising a first cap layer and said second gate electrode structures comprising a second cap layer;

forming a spacer layer and an etch stop layer above said first and second gate electrode structures;

performing a first etch sequence to form a first sidewall spacer at sidewalls of said first gate electrode structure from said spacer layer;

forming first cavities in first drain and source areas of said first transistor using said first sidewall spacer and said first cap layer as a mask;

forming a first strained semiconductor material in said first cavities;

after forming said first strained semiconductor material, removing at least said first sidewall spacer from said first gate electrode structure;

after removing said first sidewall spacer and said first cap layer, selectively removing said etch stop layer from above said second transistor;

after selectively removing said etch stop layer from above said second transistor, performing a second etch sequence to form a second sidewall spacer at sidewalls of said second gate electrode structure from said spacer layer;

forming second cavities in second drain and source areas of said second transistor using said second sidewall spacer and said second cap layer as a mask; and forming a second strained semiconductor material having a different material composition than said first strained semiconductor material in said second cavities.

18. The method of claim 17, wherein performing said first etch sequence comprises performing a first etch process to selectively remove said etch stop layer from above said first transistor, and thereafter performing a second etch process to selectively remove substantially horizontal portions of said spacer layer formed above said first cap layer and said first drain and source areas.

* * * * *